United States Patent [19]

Uehara et al.

[11] 4,306,011

[45] Dec. 15, 1981

[54] PHOTOSENSITIVE COMPOSITE AND PHOTOSENSITIVE LITHOGRAPHIC PRINTING PLATE

[75] Inventors: Masafumi Uehara; Akio Iwaki; Yoko Ogawa; Fumio Shimada; Masatoshi Matsuzaki, all of Hino, Japan

[73] Assignee: Konishiroku Photo Industry Co., Ltd., Tokyo, Japan

[21] Appl. No.: 154,120

[22] Filed: May 28, 1980

[30] Foreign Application Priority Data

Jun. 16, 1979 [JP] Japan ................................. 54/76217

[51] Int. Cl.³ ........................ G03C 1/54; C08G 8/32; C08G 8/20
[52] U.S. Cl. ................................. 430/190; 430/302; 528/162
[58] Field of Search .............. 430/190, 192, 326, 302; 528/162; 260/141

[56] References Cited

U.S. PATENT DOCUMENTS

| | | |
|---|---|---|
| 3,046,120 | 7/1962 | Schmidt et al. ..................... 430/190 |
| 3,635,709 | 1/1972 | Kobayashi ........................... 430/191 |
| 3,647,443 | 3/1972 | Rauner et al. ...................... 430/190 |
| 4,123,279 | 10/1978 | Kobayashi ........................... 430/193 |

FOREIGN PATENT DOCUMENTS

| | | | |
|---|---|---|---|
| 43-28403 | 6/1968 | Japan .................................. 430/190 |
| 1329888 | 9/1973 | United Kingdom ............... 430/190 |
| 1330932 | 9/1973 | United Kingdom ............... 430/190 |

OTHER PUBLICATIONS

*Derwent Publication Ltd.*, No. 52914v/29, Jap. Pat. No. 49-24361, 6/1974.

*Primary Examiner*—Charles L. Bowers, Jr.
*Attorney, Agent, or Firm*—Bierman & Bierman

[57] ABSTRACT

A photosensitive composition useful for making a photosensitive lithographic printing plate are made from a condensation product of sulfonyl chloride of o-benzoquinone diazide or o-naphthoquinone diazide and a polyhydric phenol resin obtained by condensing a polyhydric phenol such as 2-methyl resorcinol with an aldehyde or ketone.

9 Claims, No Drawings

PHOTOSENSITIVE COMPOSITE AND PHOTOSENSITIVE LITHOGRAPHIC PRINTING PLATE

The present invention relates to a photosensitive composite used for a photosensitive lithographic printing plate and more particularly to a photosensitive composite of o-quinonediazide type.

It is known that when an o-quinonediazide compound is irradiated by an active ray, it decomposes to produce a carboxylic acid of 5 members ring compound which is soluble in alkali, and with such nature being utilized, a photosensitive positive lithographic printing plate is made. Many of these o-quinonediazide compounds have been known so far and most of them are a compound of low molecular weight, therefore when these o-quinonediazide compounds are used independently as a photosensitive material, crystal separates out and the physical strength of an image is so weak that printing of many sheets of paper is difficult. Therefore, together with o-quinonediazide compounds, an alkali-soluble resin such as phenolformaldehyde resin, cresolformaldehyde resin or styrene-anhydrous maleic acid resin is used as a carrier. In such case, the development is done utilizing a change of alkali-solubility of low-molecular o-quinonediazide compound by the exposure, and due to the fact that an alkali-soluble resin is a carrier, there have been some weak points—the range of developer concentration with which the proper development can be reproduced is narrow and non-exposure portion is lost remarkably or a part of an image is damaged and dissolved when developed.

Some examples to polymerize the photosensitive substance itself as a method to improve the above-mentioned weak points have been known.

For example, U.S. Pat. No. 3,046,120, Japanese Pat. Nos. 43-28403, 49-24361, 50-5083 and 50-5084 and Japanese Pat. L-O-P No. 50-36206 are given as an example. Among these patents, U.S. Pat. No. 3,046,120, Japanese Pat. No. 50-5083 and Japanese Pat. L-O-P No. 50-36206 disclose that the o-naphthoquinonediazide group is substituted in a condensation type resin with a phenol or a substituted phenol and an aldehyde. In a photosensitive resin led from a condensation type resin with a phenol or a substituted phenol and an aldehyde, remaining hydroxyl group decreases because of esterification with o-naphthoquinonediazidsulfonylchloride, and thereby the developing performance by aqueous alkaline solution remarkably lowers and an image strength is low and the chemical resistance for various kinds of processing agents is poor which might be caused by its low adhesiveness to the support especially to the aluminum plate. In case the chemical resistance on the photosensitive layer is low, the problems such as image reproducibility of low grade and decreased durability for printing may happen.

On the other hand, as an example in which o-naphthoquinonediazide group is substituted in a condensation type resin with polyhydric phenol and aldehyde or ketone group, Japanese Pat. Nos. 43-28403, 49-24361 and 50-5084 are given. In a photosensitive resin led from a condensation type resin with polyhydric phenol and aldehyde or ketone group, the developing performance by an aqueous alkaline solution and adhesiveness to the support especially to the aluminum plate are relatively excellent but hydrophobicity is poor due to too many hydroxyl groups contained and thereby the ink acceptability is poor and the chemical resistance for various processing agents is still insufficient. In case the ink acceptability of the photosensitive layer is poor, the problems such as the reduction of image density on prints and the fall of durability for printing or being hard to keep the balance between water and ink for printing, may happen.

The object of the present invention is therefore to offer a photosensitive composite for the lithographic printing plate in which the disadvantages and weak points of such kind of the conventional photosensitive composite are solved.

The photosensitive composite related to the present invention is good in its preservability, in its film forming performance and in its adhesiveness to the aluminum support, and the lithographic printing plate made of the said photosensitive composite is excellent in its developability, the resistance to the processing agent, and ink acceptability of the developed printing plate compared with those made of the conventional photosensitive composite.

The present inventors have found a photosensitive composite which is characterized in containing a condensation product of sulfonylchloride of o-benzoquinonediazide or o-naphthoquinonediazide and polyhydroxyphenyl resin shown in the following general formula:

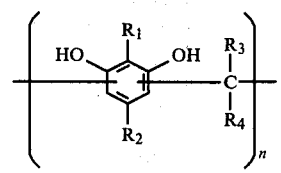

(In the formula, $R_1$ is an alkyl group having 1 to 8 carbon atoms. $R_2$ is a hydrogen or halogen atom, or a lower alkyl or alkoxy group (number of carbon: 1–4), $R_3$ and $R_4$ is hydrogen atom or a lower alkyl group (number of carbon: 1–4) or a phenyl group, and "n" is an integer of 3 and over.)

The resin of the formula is synthesized by reacting a polyhydric phenol and an aldehyde or ketone.

As for examples of the polyhydric phenol, the following are given; 2-methylresorcine, 2-ethylresorcine, 2-propylresorcine, 2-isopropylresorcine, 2-t-butylresorcine, 2-pentylresorcine, 2-hexylresorcine, 2-octylresorcine, 2-methyl-5-chloresorcine, 2-ethyl-5-chloresorcine, 2,5-dimethylresorcine, 2-methyl-5-ethylresorcine, 2-methyl-5-methoxyresorcine, 2,5-diethylresorcine, 2-t-butyl-5-methylresorcine, 2-t-butyl-5-methylresorcine, etc., and among the above, 2-methylresorcine or 2-ethylresorcine (namely $R_1$ is a methyl or ethyl group in the formula) is particularly preferable.

And, as for the examples of aldehyde or ketone, the following are given; formaldehyde, acetaldehyde, propylaldehyde, butylaldehyde, benzaldehyde, acetone, methylethylketone, diethylketone, acetophenone, etc., among the above, acetaldehyde or acetone (namely in case that $R_3$ is a methyl group or a hydrogen atom and $R_4$ is a methyl group in the formula) is particularly preferable.

Polyhydroxyphenyl resin with the aforementioned general formula in the present invention is composed as follows. Namely, when 1 mol of the aforesaid polyhydric phenol and 0.85–1.0 mol of the aforesaid aromatic aldehyde or ketone group by themselves or in an alcoholic solution are condensed with a catalyzer of acid such as hydrochloric acid and oxalic acid or of alkali such as sodium hydroxide and aqueous ammonia, then a desired resin may be obtained. In such case, it is possible to obtain with a molecular weight of any value by changing the mol ratio for preparation of each monomer and reaction conditions of condensation variously. However, in order to offer effectively for the use of the object of the present invention, the n of the general formula has a value so that the molecular weight of the resin is about 600–10000 preferably about 800–4000.

A typical example of synthesis of polyhydroxyphenyl resin related to the present invention will be shown as follows.

Synthesis example 1

2-methylresorcin 621 g is dissolved in 1 l of ethanol and then 20 g of acetaldehyde is added thereto and as a catalyzer, 0.5 ml of 35% concentrated hydrochloric acid is added. The mixture is stirred and heated in the oil bath and after the start of boiling reflux of the reacting mixture caused by the heat generation from the reaction heat, heating is made slightly lowered, and for another 90 minutes heating and reflux are continued. After the reaction, the reacted mixture is poured into 5 l of cold water with stirring, thereby powder resin of light-brown color is obtained. The yield thereof is 637 g. The molecular weight of this condensation product measured with the method of osmotic pressure is about 2100.

Synthesis example 2

In 1 l of acetone, 621 g of 2-methylresorcin is dissolved and as a catalyzer, 30 g of phosphorusoxychloride is added. After the mixture is stirred for 24 hours at the room temperature, it is poured, with stirring, into 10 l of cold water. Powder resin of light-brown color is obtained. The yield thereof is 656 g. The molecular weight of this condensation product measured with the method of osmotic pressure is about 2000.

Synthesis example 3

In 1 l of dioxane, 690 g of 2-ethylresorcin is dissolved and then 530 g of benzaldehyde is added, and 30 g of phosphorusoxychloride is added as a catalyzer. The mixture is stirred for 24 hours at room temperature. After the reaction, the reacted mixture is poured, with stirring, into 5 l of cold water, thereby powder resin of light-brown color is obtained. The yield thereof was 1073 g. The molecular weight of this condensation product measured with the method of osmotic pressure is about 1800.

Synthesis example 4

In 1 l of ethanol, 691 g of 2,5-dimethylresorcin is dissolved and then 348 g of 37% formaldehyde and as a catalyzer, 0.5 ml of 35% concentrated chloric acid are added. The mixture is heated, with stirring, in the oil bath and after the starting of boiling reflux of the reacting mixture caused by the heat generation from the reaction heat, heating was slightly lowered and heating and stirring were continued for 90 minutes. After the reaction, the reacted mixture is poured, with stirring, into 5 l of cold water, thereby powder type resin of light-brown color is obtained. The yield thereof is 683 g. The molecular weight of this condensation product measured with the method of osmotic pressure is about 1500.

Further, other polyhydroxyphenyl resin can also be synthesized in the same manner as those of synthesis examples mentioned above.

A sulfonylchloride of o-benzoquinonediazide or o-naphthoquinonediazide which is applicable to the present invention is concretely 4-chlorosulfonyl-o-benzoquinonediazide, or 4-chlorosulfonyl-o-naphthoquinonediazide or 5-chlorosulfonyl-o-naphthoquinonediazide, or its derivative.

Condensation product of the sulfonylchloride of o-benzoquinonediazide or of o-naphthoquinonediazide (which is referred as a "sulfonylchloride of diazid compound" hereinafter) and polyhydroxyphenyl resin is synthesized as follows. Namely, the sulfonylchloride of diazid compound and polyhydroxyphenyl resin are dissolved in the solvent such as dioxane or tetrahydrofuran and alkali such as sodium carbonate or potassium carbonate is added with stirring and heating at 40°–50° C., which easily esterificates. For all cases of polyhydroxyphenyl resin in examples of the present specification, the yield is more than 90%. Regarding the reaction ratio of the sulfonylchloride of diazide compound to polyhydroxyphenyl resin, the molecular ratio is 1:0.4–1:20, preferably 1:0.5–1:1.5, and in weight, the ratio is 1:0.5–1:3, preferably 1:0.7–1:2. It is preferable that these condensation products are used independently but, if circumstances require, it is possible to mix with alkali soluble novolak resin with an arbitrary ratio and by changing this mixing ratio, it is possible to freely regulate the developability of the photosensitive layer by alkaline water solution. The result condensation product of the present invention is dissolved in the solvent such as methylcellosolve, cellosolve, methylcellosolve acetate, dioxane and methylethylketone etc. and is coated onto the proper support such as aluminum plate, zinc plate, copper plate, magnesium plate, plastic film and paper etc., among which the aluminum plate is most suitable. The range of the coating weight of the photosensitive layer of 0.1–4 g/m$^2$ proved to be satisfactory as a printing plate and the range of 1–3 g/m$^2$ is especially satisfactory. Abovementioned photosensitive composite can contain various kinds of additives that have been used.

As for the original plate onto which the condensation product of the present invention is coated, the releaf image of positive-positive type is obtained by contacting the original picture having line drawing or half-tone dot image onto the photosensitive surface for exposure and by developing with alkaline water solution. As a light source suitable for the exposure, carbon arc lamp, xenon lamp, mercury lamp, chemical lamp, photographic flash lamp and tungsten lamp are used and as a typical actual example of alkaline water solution used for the development, water solution such as sodium hydroxide, potassium hydroxide, calcium hydroxide, sodium carbonate, potassium carbonate, sodium metaboric acid, tertiary sodium phosphate, secondary sodium phosphate, sodium metasilicate and sodium formic acid etc. are given for example.

A lithographic printing plate, of which the photosensitive layer contains a resin of the present invention is superior in the development performance, that is, in comparison with diazoxide resin of cresol-formaldehyde which is being practically used so far, it was found the fact that the alkaline density of developer is good enough to be used by ½ to ⅓ of that of the diazoxide resin of cresol-formaldehyde. Further, a large number of prints can be made with the image thus obtained without any necessity of applying with such an additive as a sensitive improver because it has superb ink receptivity and chemical resistance. These effects are in all likelihood due to the nature of polyhydroxy phenyl resin itself, that is, it is certain that the superb ink receptivity is due to the existence of many alkyl groups in the side chains of alkyl derivatives of polyhydroxy phenyl resin and that the superb development performance is due to the existence of many unreacted hydroxyl groups therein. The presensitized plate being used with the photosensitive composite relating to the present invention is the really useful one, as described above.

Further explanation will be made actually as follows with examples.

EXAMPLE 1

In 1 l of ethylcellosolve, 100 g of condensation product of 7 by weight of 1,2-naphthoquinone-2-diazid-5-sulfonylchloride and 10 by weight of 2-methyl resorcinacetaldehyde resin (product by synthesis example 1) and 0.7 g of dye (Methylen Blue Conc. made by Sumitomo Chemical Co., Ltd.) are dissolved thereby photosensitive liquid is prepared and this photosensitive liquid is coated with a wheeler onto the grained aluminum plate with the thickness of 0.24 mm so that the weight after drying is 1.8 g per 1 $m^2$.

On the surface of the photosensitive plate thus prepared, the positive transparent original picture is contacted and an exposure is made for 40 seconds by a metalhalide lamp of 2 KW positioned at 70 cm distance. After the photosensitive plate is dipped in 2% water solution of sodium metasilicate, the exposed portion is quickly dissolved and the offset printing plate that is excellent in its ink receptivity and resistance for processing agent is obtained.

After this printing plate is set in the offset press and printing is made, it proved to be excellent in its ink receptivity and a large number of prints with good image were obtained.

COMPARATIVE EXAMPLE 1

In 1 l of ethylcellosolve, 100 g of condensation product of 7 by weight of 1,2-naphthoquinone-2-diazide-5-sulfonylchloride and 10 by weight of cresol-formaldehyde resin (phenolresin MP-707 made by Gun-ei Chemical Industry Co., Ltd.) and 0.7 g of dye (Crystalviolet made by Hodogaya Chemical Co., Ltd.) are dissolved thereby photosensitive liquid is prepared and this photosensitive liquid is coated onto the grained aluminum plate in the same manner as the aforesaid one so that the thickness of the coated layer after drying is 1.8 g/$m^2$.

The photosensitive plate thus prepared is exposed on the same conditions as the aforesaid one and then the development thereof is tried in the same manner in 2% solution of sodium metasilicate which showed that it takes longer developing time and that ink adhered the entire surface after applying ink for developing. As the concentration of solution of sodium metasilicate is raised, it is found that the concentration with which the development is made perfectly on the same conditions as the case of the aforesaid polyhydroxyphenyl series was 6%.

When the printing plate thus obtained is tried on an offset printer to print, it is found the facts that the ink receptivity is remarkably inferior and that the spoilage required approximately two times more than that in case of using alkyl derivatives of polyhydroxy phenyl until a printed matter having enough ink density can be obtained from an early impression thereof, and further that the printing durability thereof was approximately ⅔ of that of the said compared material.

Next, the chemical resistance of the two kinds of the printing plates thus obtained as above are compared with each other. Firstly, the durability against isopropylalcohol which is used with the Dahlgren damping system is examined. When the said two kinds of the printing plates are soaked in 50% solution of isopropylalcohol for an hour at the room temperature, the ratio of the image loss of the plate coated with cresol-formaldehydes photosensitizer is at 64 weight percent, while that of the plate coated with polyhydroxyphenyls photosensitizer is at 23 weight percent. The series which combines the photosensitizer binding quinonediazide group with a monomer (e.g. a combination of orthonaphthoquinone diazide sulfonyl ester of cumyl phenol and cresol-formaldehyde resin) is served as the photosensitive layer of the printing plate, and the resistance against isopropylalcohol of the said printing plate is at 93 weight percent of the image loss ratio under the same conditions.

There are a number of chemicals to be used for processing printing plates, and the order of the chemical resistance has shown the closely resemble inclination even with the others than the above. For instance, the durability against developing ink (PS Plate Developing Ink, PI-2, made by Fuji Photo Co., Japan) is also in the similar order, and after the above described three kinds of the printing plates are soaked in for 30 minutes at the room temperature, the photosensitive plates of cumyl phenol esters and of cresol formaldehydes out of the three are both harmed by the ink component and the aluminium surfaces thereof are partially bared, on the other hand, the photosensitive substance of polyhydroxyphenyls is not harmed by the ink component and the aluminium surface is not bared.

COMPARATIVE EXAMPLE 2

100 g of the condensed product of 8 by weight of 1,2-naphthoquinone-2-diazide-5-sulfonylchloride and 10 by weight of resorcine-acetaldehyde resin, and 0.7 g of dyestuff (methylene Blu-Conc., by Sumitomo Chemical Industry Co., Japan) are dissolved in 1 l of ethylcellosolve, by which the photosensitive liquid is prepared. Following the same method of the example 1, the said photosensitive liquid is coated onto a sandblasted aluminium plate by a wheeler, so that the weight of the liquid after dried becomes 1.8 g per sq. meter. Thus prepared photosensitive plate is exposed under the same conditions as that of the example 1 and is developed in 2% solution of sodium metasilicate and then the development is made quickly as similar to the case of the example 1.

Next, the photosensitive plates according to the example 1 and from the above described are compared with each other concerning their ink receptivity and chemical resistance. When each of the said plates is tried on an offset printer to print under the similar conditions to that of the comparative example 1, the photosensitive substance of resorcine-formaldehydes is inferior in the ink receptivity and required the spoilage approximately 2 times more until a printed matter obtains enough density of ink and further its printing durability is approximately ⅔, in comparison with the photosensitive plate according to the example 1.

Next, the chemical resistance of the said two kinds of the printing plates are compared with each other under the similar conditions to that of the comparison example 1. The ratio of image loss of the photosensitive substance of resorcine-benzaldehydes after soaked it into 50% solution of isopropyl alcohol is at 22 weight percent, while that of the photosensitive substance of resorcine-formaldehydes is at 55 weight percent.

EXAMPLE 2

50 g of condensed product of 20 by weight of 1,2-naphthoquinone-2-diazide-5-sulfonylchloride and 10 by weight of 2-methylresorcine-acetone resin (obtained according to Synthesis example 2), 70 g of cresol-formaldehyde resin (Sumilite Resin PR-SK-1 made by Sumitomo Durez Company, Ltd., Japan) and 1 g of dyestuff (Oil-Blue-2N made by Orient Chemical Company) are dissolved in 1 l of methylcellosolve to prepare photosensitive liquid, and the said photosensitive liquid is coated onto the sandblasted aluminium plate of 0.30 mm in thickness by a wheeler so that the weight of the liquid after dried becomes 2.3 g per sq. meter.

A positive transparent original is placed in contact with the surface of thus prepared photosensitive plate and the exposure is made thereon by 2 KW metal halide lamp from the distance of 1 meter for 90 seconds of time. Successively the said photosensitive plate is tried to soak into the solution of 3% sodium metasilicate, and at that time the exposed area is dissolved quickly, and then an offset printing plate having a superb oil-sensitivity and chemical resistance is obtained. When this printing plate is tried on an offset printer to print, the ink receptivity is superior and the spoilage required approximately one third ($\frac{1}{3}$) until a printing matter having enough ink density is obtained and further that the printing durability thereof is approximately 2 times more, in comparison with the conventional photosensitive substance using cresol-formaldehydes.

Next, with regard to the said printing plate, the chemical resistance thereof is tested under the similar conditions to the example 1, and the ratio of the image loss after soaked in 50% solution of isopropylalcohol is proved at 28 weight percent.

Further, when the surface of the photosensitive plate is checked after soaked in the developing ink (PS plate Developing Ink PI-2 made by Fuji Photo Film Company, Japan), the aluminium surface is not harmed by the ink components and also is not bared.

EXAMPLE 3

100 g of the condensed product of 8 by weight of 1,2-naphthoquinone-2-diazide-5-sulfonylchloride and 10 by weight of 2-ethylresorcine-benzaldehyde resin (Product according to Synthesis example 3), and 0.7 g of the dyestuff (Victoria Pure Blue. BOH, made by Hodogaya Chemical Industry Co., Japan), are dissolved in 1 l of ethylcellosolve to prepare the photosensitive liquid and the said photosensitive liquid is coated onto the sandblasted aluminium plate by means of the similar method to that of the example 1. After thus prepared photosensitive plate is exposed to light for 50 sec. by means of the similar method to that of the example 1, the said plate is developed in 5% aqueous solution of tertiary sodium phosphate and then an offset printing plate having the superb oil-sensitivity and chemical resistance is obtained.

When this printing plate is tried on an offset printer to print, the ink receptivity is superior and the spoilage required approximately $\frac{1}{4}$ until a printing matter having enough density is obtained and further the printing durability is approximately 2 times more, in comparison with the conventional photosensitive substance using cresol-formaldehydes.

Next, with regard to the said printing plate, the chemical resistance thereof is tested under the similar conditions to those of the example 1, and the ratio of the image loss after soaked in 50% solution of isopropylalcohol is proved at 21 weight percent, and the aluminium surface is not harmed by soaking in the developing ink (PS plate Developing Ink PI-2, made by Fuji Photo Film Co., Japan) and is not bared.

What is claimed is:

1. Photosensitive composition containing a condensation product of sulfonylchloride of o-benzoquinonediazide or o-naphthoquinonediazide and a polyhydric phenol resin shown in the following general formula:

General formula

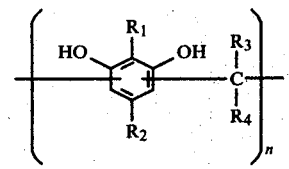

where, $R_1$ is an alkyl group having 1 to 8 carbon atoms, $R_2$ is a hydrogen or halogen atom or a lower alkyl or alkoxy group (whose number of carbon are 1–4 individually), $R_3$ and $R_4$ are individually a hydrogen atom or a lower alkyl group (number of carbon: 1–4) or a phenyl group, and n is an integer of 3 or more.

2. A photosensitive lithographic printing plate having photosensitive layer coated on a support which layer contains a photosensitive composite according to claim 1.

3. Photosensitive composition according to claim 1 wherein $R_3$ represents a hydrogen atom or a methyl group and $R_4$ represents a methyl group.

4. Photosensitive composition according to claim 1 wherein a molecular weight of the polyhydric phenol resin is 800–4000.

5. Photosensitive composition according to claim 1 wherein a molecular ratio of the sulfonylchloride of o-benzoquinonediazide or o-naphthoquinonediazide to the polyhydric phenol is 1:0.4–1:2.

6. A photosensitive composition according to claim 1 wherein the sulfonylchloride of o-benzoquinonediazide or o-naphthoquinonediazide is 4-chlorosulfonyl-o-benzoquinonediazide, 4-chlorosulfonyl-o-naphthoquinonediazide or 5-chlorosulfonyl-o-naphthoquinonediazide, or its derivative.

7. Photosensitive composite according to claim 6 wherein the sulfonylchloride of o-naphthoquinonediazide is 4-chlorosulfonyl-o-naphthoquinonediazide or 5-chlorosulfonyl-o-naphthoquinonediazide.

8. Photosensitive composition according to claim 1 wherein $R_2$ represents a methyl or ethyl group.

9. A composition of claim 1, wherein $R_1$ is methyl or ethyl.

* * * * *